United States Patent
Lee et al.

(10) Patent No.: US 10,866,362 B2
(45) Date of Patent: Dec. 15, 2020

(54) ETCHANT AND ETCHING PROCESS FOR SUBSTRATE OF A SEMICONDUCTOR DEVICE

(71) Applicant: Taiwan Semiconductor Manufacturing Company, Ltd., Hsinchu (TW)

(72) Inventors: Wan-Yu Lee, Taipei (TW); Ying-Hao Kuo, Hsinchu (TW); Hai-Ching Chen, Hsinchu (TW); Tien-l Bao, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/441,785

(22) Filed: Jun. 14, 2019

(65) Prior Publication Data

US 2019/0293868 A1 Sep. 26, 2019

Related U.S. Application Data

(62) Division of application No. 15/339,446, filed on Oct. 31, 2016, now Pat. No. 10,353,147, which is a
(Continued)

(51) Int. Cl.
*H01L 21/30* (2006.01)
*C09K 13/02* (2006.01)
*G02B 6/136* (2006.01)
*G02B 6/42* (2006.01)
*H01L 21/306* (2006.01)
(Continued)

(52) U.S. Cl.
CPC .............. *G02B 6/136* (2013.01); *C09K 13/02* (2013.01); *G02B 6/1221* (2013.01); *G02B 6/42* (2013.01); *H01L 21/3085* (2013.01); *H01L 21/30604* (2013.01); *H01L 21/30608* (2013.01); *G02B 2006/12104* (2013.01)

(58) Field of Classification Search
CPC ........... H01L 21/30; G02B 6/136; G02B 6/42; C09K 13/02
USPC ........................................................ 257/622
See application file for complete search history.

(56) References Cited

U.S. PATENT DOCUMENTS

| | | |
|---|---|---|
| 4,042,444 A | 8/1977 | Snyder |
| 5,391,917 A | 2/1995 | Gilmour et al. |

(Continued)

FOREIGN PATENT DOCUMENTS

| | | |
|---|---|---|
| CN | 1910486 | 2/2007 |
| TW | 201131229 | 9/2011 |
| TW | 201142391 | 12/2011 |

OTHER PUBLICATIONS

Ma et al., "Polymer-Based Optical Waveguides: Materials, Processing, and Devices," Advanced Materials, Oct. 2, 2002, vol. 14, No. 19, pp. 1339-1365.

(Continued)

*Primary Examiner* — Fazli Erdem
(74) *Attorney, Agent, or Firm* — Slater Matsil, LLP (57) ABSTRACT

A system and method for manufacturing semiconductor devices is provided. An embodiment comprises using an etchant to remove a portion of a substrate to form an opening with a 45° angle with a major surface of the substrate. The etchant comprises a base, a surfactant, and an oxidant. The oxidant may be hydrogen peroxide.

20 Claims, 3 Drawing Sheets

Related U.S. Application Data division of application No. 13/749,388, filed on Jan. 24, 2013, now Pat. No. 9,484,211.

(51) Int. Cl.
*G02B 6/122* (2006.01)
*H01L 21/308* (2006.01)
*G02B 6/12* (2006.01)

(56) References Cited

U.S. PATENT DOCUMENTS

| | | | |
|---|---|---|---|
| 5,510,298 | A | 4/1996 | Redwine |
| 5,577,142 | A | 11/1996 | Mueller-Fiedler et al. |
| 5,767,001 | A | 6/1998 | Bertagnolli et al. |
| 5,846,398 | A | 12/1998 | Carpio |
| 5,863,232 | A | 1/1999 | Lee |
| 5,964,629 | A | 10/1999 | Park et al. |
| 5,998,292 | A | 12/1999 | Black et al. |
| 6,027,255 | A | 2/2000 | Joo et al. |
| 6,048,256 | A | 4/2000 | Obeng et al. |
| 6,184,060 | B1 | 2/2001 | Siniaguine |
| 6,322,903 | B1 | 11/2001 | Siniaguine et al. |
| 6,448,168 | B1 | 9/2002 | Rao et al. |
| 6,465,892 | B1 | 10/2002 | Suga |
| 6,472,293 | B1 | 10/2002 | Suga |
| 6,538,333 | B2 | 3/2003 | Kong |
| 6,576,150 | B1 | 6/2003 | Weigert |
| 6,599,778 | B2 | 7/2003 | Pogge et al. |
| 6,639,303 | B2 | 10/2003 | Siniaguine |
| 6,664,129 | B2 | 12/2003 | Siniaguine |
| 6,693,361 | B1 | 2/2004 | Siniaguine et al. |
| 6,740,582 | B2 | 5/2004 | Siniaguine |
| 6,800,930 | B2 | 10/2004 | Jackson et al. |
| 6,807,204 | B1 | 10/2004 | Dowd |
| 6,841,883 | B1 | 1/2005 | Farnworth et al. |
| 6,882,030 | B2 | 4/2005 | Siniaguine |
| 6,924,551 | B2 | 8/2005 | Rumer et al. |
| 6,962,867 | B2 | 11/2005 | Jackson et al. |
| 6,962,872 | B2 | 11/2005 | Chudzik et al. |
| 7,030,481 | B2 | 4/2006 | Chudzik et al. |
| 7,049,170 | B2 | 5/2006 | Savastiouk et al. |
| 7,060,601 | B2 | 6/2006 | Savastiouk et al. |
| 7,071,546 | B2 | 7/2006 | Fey et al. |
| 7,111,149 | B2 | 9/2006 | Eilert |
| 7,122,912 | B2 | 10/2006 | Matsui |
| 7,157,787 | B2 | 1/2007 | Kim et al. |
| 7,193,308 | B2 | 3/2007 | Matsui |
| 7,262,495 | B2 | 8/2007 | Chen et al. |
| 7,297,574 | B2 | 11/2007 | Thomas et al. |
| 7,335,972 | B2 | 2/2008 | Chanchani |
| 7,355,273 | B2 | 4/2008 | Jackson et al. |
| 8,987,181 | B2 | 3/2015 | Pollard et al. |
| 9,484,211 | B2 | 11/2016 | Lee et al. |
| 9,618,712 | B2 | 4/2017 | Kuo et al. |
| 9,696,486 | B2 | 7/2017 | Zheng et al. |
| 10,353,147 | B2 * | 7/2019 | Lee .............. G02B 6/1221 |
| 2004/0192050 | A1 | 9/2004 | Yamashita |
| 2004/0238120 | A1 | 12/2004 | Lin et al. |
| 2004/0252619 | A1 | 12/2004 | Hwang |
| 2005/0185687 | A1 | 8/2005 | Ohgoh |
| 2006/0239605 | A1 | 10/2006 | Palen et al. |
| 2007/0058901 | A1 | 3/2007 | Oohara et al. |
| 2007/0280585 | A1 | 12/2007 | Warashina et al. |
| 2009/0022500 | A1 | 1/2009 | Pinguet et al. |
| 2009/0129720 | A1 | 5/2009 | Asghari et al. |
| 2010/0025374 | A1 | 2/2010 | Voipio |
| 2010/0092888 | A1 | 4/2010 | Buchine et al. |
| 2010/0119231 | A1 | 5/2010 | Kim et al. |
| 2010/0142886 | A1 | 6/2010 | Warashina et al. |
| 2010/0187200 | A1 | 7/2010 | Spiro et al. |
| 2010/0255427 | A1 * | 10/2010 | Wang .............. G03F 7/0046 430/323 |
| 2010/0266241 | A1 | 10/2010 | Hosoda |
| 2010/0270650 | A1 | 10/2010 | Li et al. |
| 2010/0273321 | A1 | 10/2010 | Wang et al. |
| 2010/0320457 | A1 | 12/2010 | Matsubara et al. |
| 2011/0303242 | A1 | 12/2011 | Kimura et al. |
| 2012/0213470 | A1 | 8/2012 | Matsuoka et al. |
| 2012/0263414 | A1 | 10/2012 | Tan et al. |
| 2012/0329200 | A1 | 12/2012 | Krishnan et al. |
| 2013/0177274 | A1 | 7/2013 | Kosenko et al. |
| 2013/0223789 | A1 | 8/2013 | Lee et al. |
| 2013/0295712 | A1 | 11/2013 | Chen et al. |
| 2014/0057383 | A1 | 2/2014 | Okuuchi |
| 2014/0206110 | A1 | 7/2014 | Lee et al. |
| 2014/0206191 | A1 | 7/2014 | Lee et al. |
| 2015/0234137 | A1 | 8/2015 | Kuo et al. |
| 2015/0362673 | A1 | 12/2015 | Zheng et al. |
| 2017/0045685 | A1 | 2/2017 | Lee et al. |
| 2017/0212318 | A1 | 7/2017 | Kuo et al. |

OTHER PUBLICATIONS

Xia et al., "The Influence of Oxidizing Agents on Etching and Passivation of Silicon in KOH Solution," Electrochimica Acta, 2000, vol. 45, pp. 4645-4653.

* cited by examiner

ETCHANT AND ETCHING PROCESS FOR SUBSTRATE OF A SEMICONDUCTOR DEVICE

PRIORITY CLAIM AND CROSS-REFERENCE

This application is a division of U.S. patent application Ser. No. 15/339,446, filed Oct. 31, 2016, entitled "Etchant and Etching Process for Substrate of a Semiconductor Device," which is a division of U.S. patent application Ser. No. 13/749,388, filed Jan. 24, 2013, now U.S. Pat. No. 9,484,211, issued Nov. 1, 2016, entitled "Etchant and Etching Process," which patent applications are incorporated herein by reference.

BACKGROUND

Generally, the etching of a substrate material, such as a silicon material, has been utilized in the formation of various structures on the substrate and in the overall manufacturing of semiconductor devices. Such etching generally may utilize a photolithographic masking and etching process. In such a process a photoresist or hardmask is formed on the surface of the substrate and patterned in order to expose a portion of the substrate. Once the photoresist or hard mask has been placed and patterned, the underlying substrate that has been exposed by the hard mask or photoresist is exposed to an etchant by physically applying an etchant or etching solution to the exposed substrate.

Once in contact with the exposed portions of the substrate, the etchant or etching solution will begin to chemically react with the portions of the exposed substrate in which the etchant or etching solution is in contact. This chemical reaction chemically alters the exposed surface of the substrate and removes portions of the substrate from the surface of the substrate, thereby etching into the substrate as the chemical reaction proceeds. Because of the hard mask or photoresist, and the selectivity of the etchant or etching solution to the material of the substrate over the material of the hard mask or photoresist, the removal of material is controlled to occur in those areas of the substrate that are uncovered and exposed by the hard mask or photoresist.

However, each etchant that may be utilized to remove material and form an opening into a material of a substrate, and each etching solution that may be utilized, have various benefits and problems. These include achieving a desired selectivity, obtaining a suitable process controllability, or even limiting the potential drawbacks of the etchant or etching solution.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a silicon optical bench 100 with a 45 degree reflector. Other embodiments may also be applied, however, to other etching processes.

Figure 1:
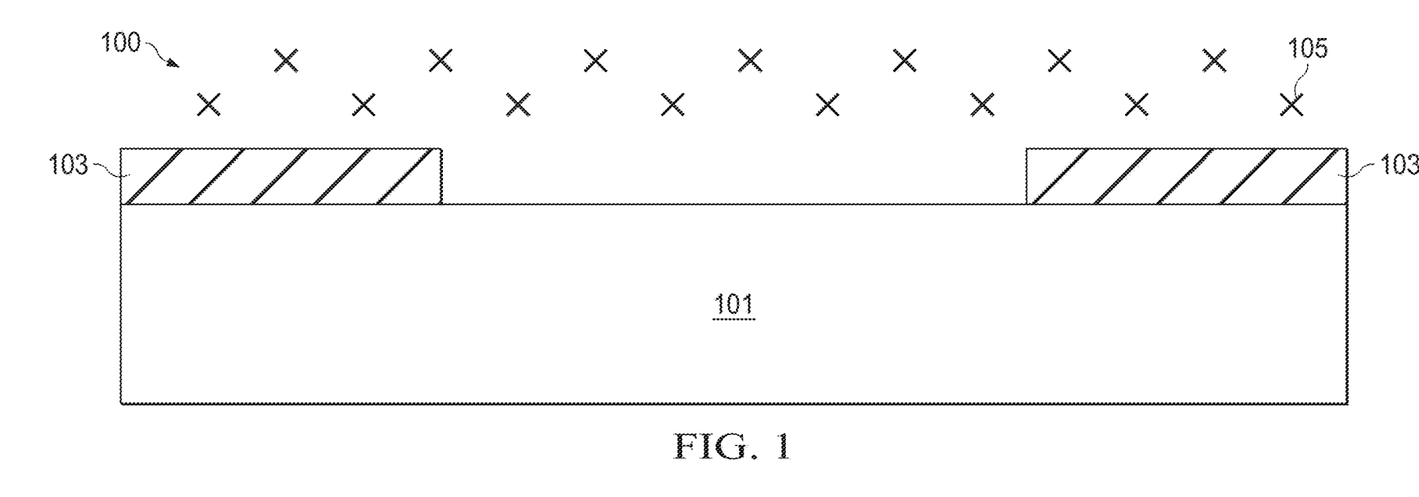
FIG. 1 illustrates a substrate exposed to an etchant in accordance with an embodiment.

With reference now to FIG. 1, there is shown a cross-sectional, simplified view of a substrate 101 into which an opening 201 (not illustrated in FIG. 1 but illustrated and discussed below with respect to FIG. 2) will be formed. The substrate 101 may comprise a semiconductor material such as silicon, germanium, diamond, or the like, with a crystal orientation of (110) or (100). Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. Additionally, the substrate 101 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 101 may be doped with a p-type dopant, such as boron, aluminum, gallium, or the like, although the substrate may alternatively be doped with an n-type dopant, as is known in the art.

To form the opening 201 into the substrate 101, a hardmask 103 may be formed over the substrate 101 and patterned to expose a portion of the substrate 101 into which the opening 201 will be formed. The hardmask 103 may be a masking material such as silicon nitride, and may be formed using a process such as plasma enhanced chemical vapor deposition (PECVD). However, any other suitable hardmask material, such as silicon oxide, and any other process of formation, such as chemical vapor deposition (CVD), may alternatively be utilized. In an embodiment the hardmask 103 may be formed to a thickness of between about 500 Å and about 5000 Å, such as about 1900 Å.

Once formed, the hardmask 103 may be patterned to expose the substrate 101 using, e.g., a photolithographic masking and etching process. In such a process a photoresist (not individually illustrated in FIG. 1) may be placed on the hardmask 103. The photoresist may comprise a conventional photoresist material, such as a deep ultra-violet (DUV) photoresist, and may be deposited on the surface of the hardmask 103, for example, by using a spin-on process to place the photoresist. However, any other suitable material or method of forming or placing the photoresist may alternatively be utilized. Once the photoresist has been placed on the hardmask 103, the photoresist may be exposed to energy, e.g. light, through a patterned reticle in order to induce a reaction in those portions of the photoresist exposed to the energy. The photoresist may then be developed, and portions of the photoresist may be removed, exposing a surface of the hardmask 103, which may then be etched to remove the exposed portions, thereby patterning the hardmask 103.

Once the hardmask 103 has been patterned, the substrate 101 exposed by the hardmask 103 may be etched by placing the exposed portions of the substrate 101 into physical contact with an etching solution (illustrated in FIG. 1 by the "X"s labeled 105). In an embodiment the etching solution 105 may be placed in to contact with the substrate 101 using an wet etching process, whereby the etching solution 105 is placed into contact the substrate 101 by either being sprayed on top of the substrate 101 or else immersing the substrate 101 into a tank or other container filled with the etching solution 105. However, these methods are intended to merely be illustrative and are not intended to be limiting, as any suitable etching process utilizing the etching solution 105 may alternatively be utilized.

The etching solution 105 is utilized to remove those portions of the substrate 101 that are not protected by the hardmask 103 using a series of chemical reactions to react with and remove those portions of the substrate 101 into which the etching solution 105 is in physical contact. In an embodiment the etching solution 105 may be an aqueous solution with multiple components such as a strong base, a surfactant, and an oxidizer. Together, these components in this solution may be utilized to etch the substrate 101 along the substrate's 101 crystallographic orientation. By etching along the crystallographic orientation of the substrate 101, the formation of the opening 201 may be controlled to provide a particular desired first angle α, such as a 45° angle. Each of these components and their respective usages within the overall etching process are described further below in the following paragraphs.

Looking initially at the strong base, the strong base may be utilized to chemically react with the bulk of the material of the substrate 101 (e.g., silicon) and to anisotropically remove the material of the substrate 101 without removing the material of the hardmask 103. In an embodiment the strong base may be a base such as potassium hydroxide (KOH), although other suitable base reactants, such as sodium hydroxide (NaOH), may alternatively be utilized. The strong base may be in the aqueous solution at a concentration of between about 25%-wt and about 35%-wt, such as about 30%-wt.

However, strong bases such as KOH by themselves do not have the selectivity to control the etching process to etch along a desired crystallographic orientation of, e.g., the first angle α of about 45°. In particular, etching the substrate 101 with an aqueous solution of KOH would result in an angle of 54.7° or even 70° from a major surface of the substrate 101. As such, in order to modify the selectivity of the strong base to obtain the desired first angle α of about 45°, the surfactant may be added to the etching solution 105. In an embodiment the surfactant may be a ionic or non-ionic surfactant, and may be a surfactant with a sulfonated base, such as However, as one of ordinary skill in the art will recognize, surfactants with sulfonate bases are not the only surfactants that may be utilized. Rather, any suitable surfactant, such as surfactants with an alkyl base, such as alkyl polysaccharide, may be utilized. This and all such surfactants are fully intended to be included within the scope of the embodiments. In an embodiment the surfactant may have a concentration within the etching solution 105 of between about 0.01%-wt and about 0.4%-wt, such as about 0.15 wt %.

However, the inclusion of such surfactants within the etching solution 105 also creates additional issues during the process of etching the material of the substrate 101. In particular, during the etching reaction the surfactant will not only aid in the selectivity of the strong base but will also react with the strong base and the water in the aqueous solution to form oil drops (not individually illustrated in FIG. 1) within the etching solution 105 and on the surface of the substrate 101. These oil drops may be up to a millimeter in size, and will be attracted to the material of the substrate 101 which is being etched. The attraction of the oil drops will interfere with the chemical reaction between the strong base, the surfactant, and the material of the substrate 101 by impeding the diffusion of the strong base and the surfactant, creating an unintended and undesired micromasking effect. This micromasking effect will interrupt the etching process in certain areas and cause the material of the substrate 101 to be unevenly etched.

In an embodiment, to counter this micromasking effect caused by undesired production of oil drops, an oxidant is added to the etching solution 105. The oxidant may be utilized to react with the material of the substrate 101 masked by the oil drop that has been attracted to the surface of the substrate 101. The oxidant will react with the material of the substrate 101 (e.g., silicon) and form an oxidized material such as silicon oxide beneath the oil drop. By oxidizing the material of the substrate 101, the material of the substrate 101 will be modified from being hydrophobic to being hydrophilic, thereby suppressing or inhibiting hydrogen bonding between the material of the substrate 101 and the oil drop and, in effect, causing the material of the substrate 101 to repel the oil drop away from the surface of the substrate 101. Once the oil drop is away from the surface of the substrate 101, the micromasking effect has been removed and the strong base and surfactant may again work to etch the material of the substrate 101 and the oxidized material formed from the substrate 101.

In an embodiment the oxidant may be hydrogen peroxide ($H_2O_2$), although any suitable oxidant, such as ozone ($O_3$) or potassium permanganate ($KMnO_4$), may alternatively be utilized. Additionally, the oxidant may be present in the etching solution 105 in a concentration large enough to be able to react with the surface of the substrate 101 underneath an oil drop, but not so large as to dominate the overall reaction characteristics of the etching solution 105. In an embodiment, the oxidant may have a concentration in the etching solution 105 of between about 0.1%-wt and about 0.2%-wt.

During the etching process, the etching solution 105 may be kept at a temperature of between about 60° C. and about 80° C., such as about 70° C. The substrate 101 may be immersed in the etching solution 105 for between about 40 μm and about 60 μm, such as about 50 μm for a time period between about 40 min and about 120 min, such as about 80 min. At such conditions that etching solution 105 will provide a well-controlled etch rate of between about 0.4 μm/min and about 1.5 μm/min and will also help to prevent the reverse reaction of the etching process whereby hillocks and bubble hillocks may be regrown on the material of the substrate 101.

Figure 2:
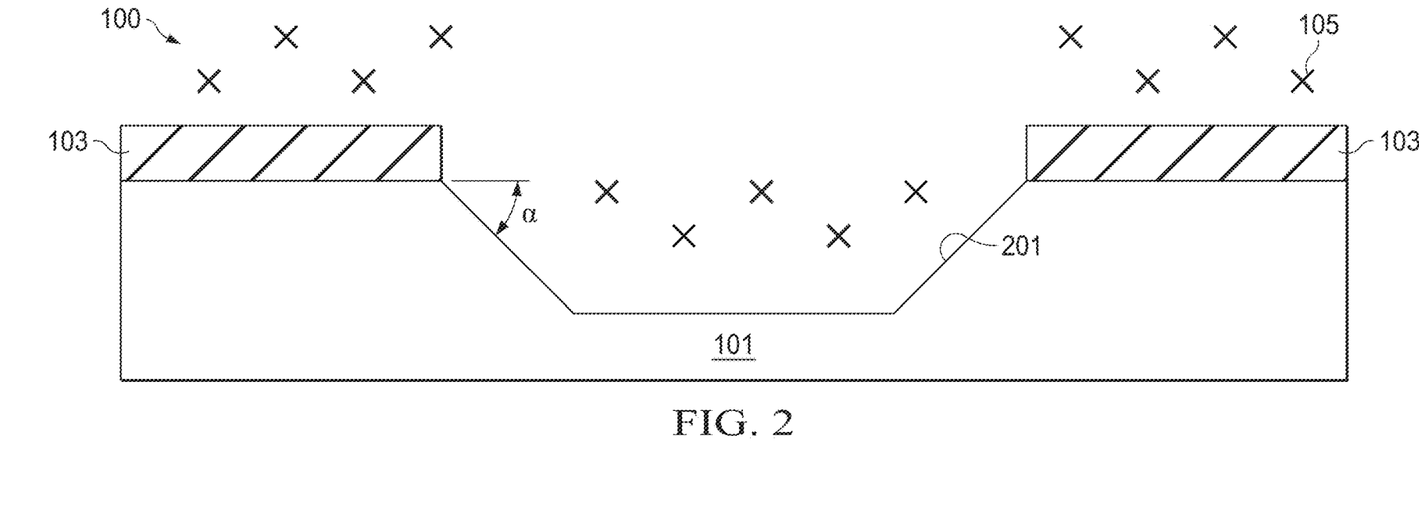
FIG. 2 illustrates a result of the etching process in accordance with an embodiment.

FIG. 2 illustrates a result of using the etching solution 105 described above to etch the substrate 101. As can be seen, the opening 201 is formed within the substrate 101 and the sidewalls of the opening 201 may be selectively etched to have a 45° angle with a major surface of the substrate 101. Additionally, with the inclusion of the oxidant within the etching solution 105 the sidewalls and bottom of the opening 201 are formed with a smoother surface due to the lack of micromasking from the oil drops that are formed between the surfactant, the strong base, and the water within the etching solution 105. Additionally, the inclusion of the oxidant will also work to inhibit or impede the reverse chemical reaction and help to prevent hillock regrowth during the etching process.

Figure 3A:
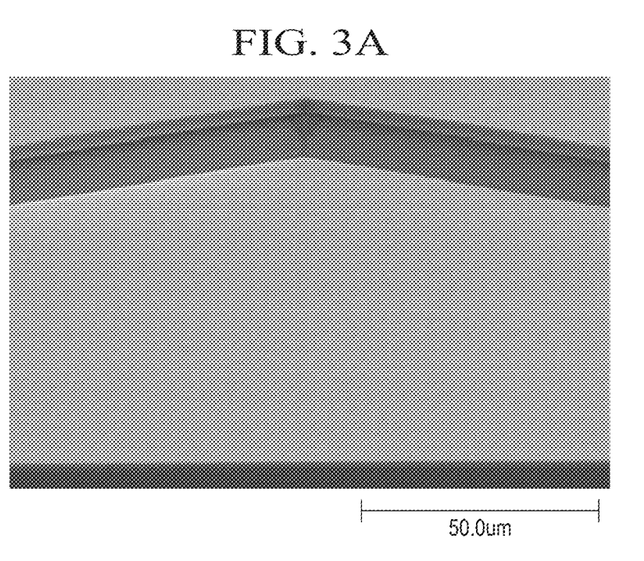
FIGS. 3A-3B illustrate test results between using a described etchant in accordance with an embodiment and using etchants not as described.
Figure 3B:
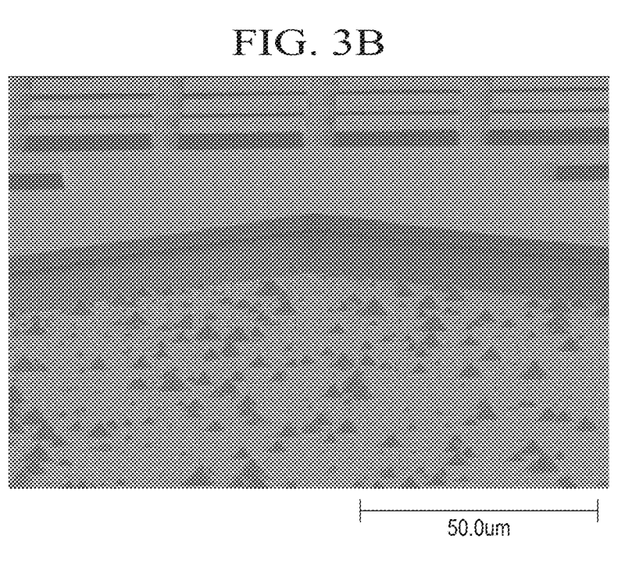

This smoother surface is additionally illustrated in FIGS. 3A-3B, with FIG. 3A illustrating the smooth surface of a material etched utilizing the etching solution 105 described above with respect to FIG. 1 and FIG. 3B illustrating an enlarged surface of a substrate etched with an etching solution of IPA and KOH. As can be seen, the material etched without the inclusion of the oxidant is uneven and rough, with hillocks forming throughout the surface. However, with the use of the etching solution 105 as described, the hillocks are removed along with the rest of the material, resulting in a much smoother and better controlled etching process.

Figure 4:
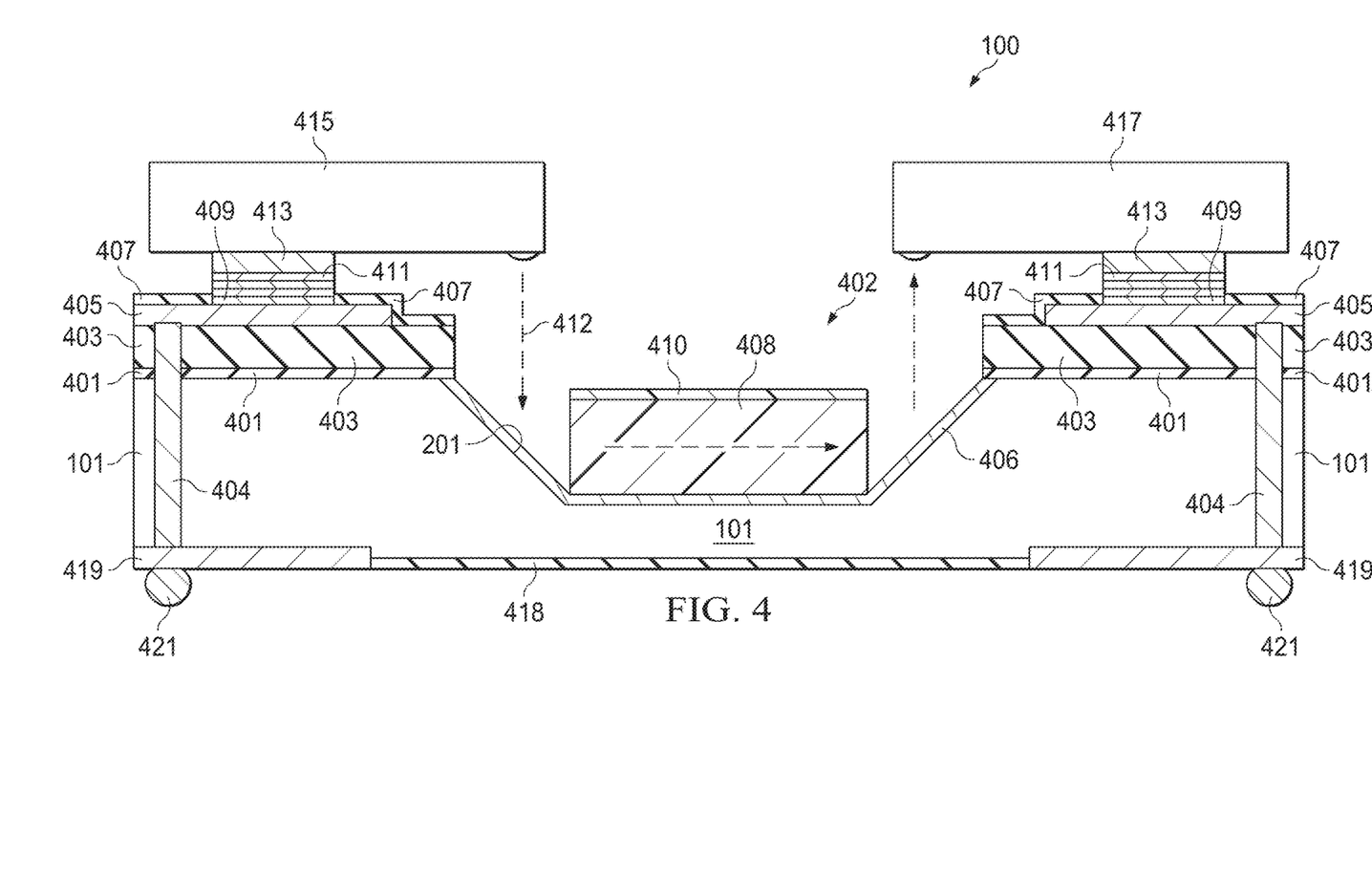
FIG. 4 illustrates a formation of additional structures to form a silicon optical bench in accordance with an embodiment.

FIG. 4 illustrates a removal of the hardmask 103 and the formation of a waveguide 402 within the opening 201 of the substrate 101. In an embodiment the waveguide 402 may be a polymer waveguide and may be formed along with a reflective material 406, a first passivation layer 401, a second passivation layer 403, through substrate vias (TSVs) 404, a redistribution layer 405, a third passivation layer 407, contact pads 409, underbump metallizations 411, contact bumps 413, an optical generating device 415, and an optical receiving device 417.

The reflective material 406 may be used to increase the amount of light 412 (discussed further below) reflected by the surface of the substrate 101 at the first angle α of about, e.g., 45°. In an embodiment the reflective material 406 may be any material that increases the reflectiveness of the material of the substrate 101, and may be, e.g., a metal such as gold, although any suitable material may alternatively be utilized. The reflective material 406 may be formed using a deposition process such as PVD, CVD, a plating process, combinations of these, or the like. Once formed, the reflective material 406 may be patterned using, e.g., a photolithographic masking and etching process, in order to be located along the sidewalls of the opening 201.

The first passivation layer 401 may be formed on the substrate 101 over the substrate 101. The first passivation layer 401 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 401 may be formed through a process such as chemical vapor deposition (CVD), although any suitable process may be utilized, and may have a thickness between about 0.5 µm and about 5 µm, such as about 9.25 KÅ.

The second passivation layer 403 may be formed over the first passivation layer 401. The second passivation layer 403 may be formed from a polymer such as polyimide. Alternatively, the second passivation layer 403 may be formed of a material similar to the material used as the first passivation layer 401, such as silicon oxides, silicon nitrides, low-k dielectrics, extremely low-k dielectrics, combinations of these, and the like. The second passivation layer 403 may be formed to have a thickness between about 2 µm and about 15 µm, such as about 5 µm.

Once the second passivation layer 403 has been formed, the TSVs 404 may be formed to provide a connection through the substrate 101 to an opposite side of the substrate 101. The TSVs 404 may be formed by applying and developing a suitable photoresist, and then etching the substrate 101, the first passivation layer 401 and the second passivation layer 403 to generate TSV openings (filled later as discussed below). The openings for the TSVs 404 at this stage may be formed so as to extend into the substrate 101 to a depth at least greater than the eventual desired height of the finished silicon optical bench 100. Accordingly, while the depth is dependent upon the overall design of the silicon optical bench 100, the depth may be between about 1 µm and about 700 µm below the surface on the substrate 101, such as a depth of about 50 µm. The openings for the TSVs 404 may be formed to have a diameter of between about 1 µm and about 100 µm, such as about 6 µm.

Once the openings for the TSVs 404 have been formed, the openings for the TSVs 404 may be filled with, e.g., a barrier layer and a conductive material. The barrier layer may comprise a conductive material such as titanium nitride, although other materials, such as tantalum nitride, titanium, a dielectric, or the like may alternatively be utilized. The barrier layer may be formed using a CVD process, such as PECVD. However, other alternative processes, such as sputtering or metal organic chemical vapor deposition (MOCVD), may alternatively be used. The barrier layer may be formed so as to contour to the underlying shape of the opening for the TSVs 404.

The conductive material may comprise copper, although other suitable materials such as aluminum, alloys, doped polysilicon, combinations thereof, and the like, may alternatively be utilized. The conductive material may be formed by depositing a seed layer and then electroplating copper onto the seed layer, filling and overfilling the openings for the TSVs 404. Once the openings for the TSVs 404 have been filled, excess barrier layer and excess conductive material outside of the openings for the TSVs 404 may be removed through a grinding process such as chemical mechanical polishing (CMP), although any suitable removal process may be used.

Once the conductive material is within the openings for the TSVs 404, a thinning of the second side of the substrate 101 may be performed in order to expose the openings for the TSVs 404 and form the TSVs 404 from the conductive material that extends through the substrate 101. In an embodiment, the thinning of the second side of the substrate 101 may leave the TSVs 404. The thinning of the second side of the substrate 101 may be performed by a planarization process such as CMP or etching.

However, as one of ordinary skill in the art will recognize, the above described process for forming the TSVs 404 is merely one method of forming the TSVs 404, and other methods are also fully intended to be included within the scope of the embodiments. For example, forming the openings for the TSVs 404, filling the openings for the TSVs 404 with a dielectric material, thinning the second side of the substrate 101 to expose the dielectric material, removing the dielectric material, and filling the openings for the TSVs 404 with a conductor may also be used. This and all other suitable methods for forming the TSVs 404 into the substrate 101 are fully intended to be included within the scope of the embodiments.

Alternatively, the TSVs 404 may be formed as each of the layers over the substrate 101 are individually formed. For example, the TSVs 404 may be formed partially concurrently with the first passivation layer 401 and the second passivation layer 403. For example, a portion of the openings for the TSVs 404 may be formed and filled within the substrate 101 prior to the formation of the first passivation layer 401, and subsequent layers of the openings for the TSVs 404 may be formed and filled as each of the first passivation layer 401 and the second passivation layer 403 are individually formed. Any of these processes, and any other suitable process by which the TSVs 404 may be formed, are fully intended to be included within the scope of the embodiments.

After the TSVs 404 have been formed, the first RDL layer 405 may be formed to extend along the second passivation layer 403. The first RDL layer 405 may be utilized as a redistribution layer to allow the contact pads 409 that are electrically connected to the TSVs 404 to be placed in any desired location on the substrate 101, instead of limiting the location of the contact pads 409 to the regions directly over the TSVs 404. In an embodiment the first RDL layer 405 may be formed by initially forming a seed layer (not shown) of a titanium copper alloy through a suitable formation process such as CVD or sputtering. A photoresist (not shown) may then be formed to cover the seed layer, and the photoresist may then be patterned to expose those portions of the seed layer that are located where the first RDL layer 405 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm, and a width along the substrate 101 of between about 5 µm and about 300 µm, such as about 15 µm. However, while the material and methods discussed are suitable to form the conductive material, these materials are merely exemplary. Any other suitable materials, such as AlCu or Au, and any other suitable processes of formation, such as CVD or PVD, may alternatively be used to form the first RDL layer 405.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

After the first RDL layer 405 has been formed, the third passivation layer 407 may be formed to cover and protect the first RDL layer 405. The third passivation layer 407, similar to the second passivation layer 403, may be formed from a polymer such as polyimide, or may alternatively be formed of a similar material as the first passivation layer 401 (e.g., silicon oxides, silicon nitrides, low-k dielectrics, extremely low-k dielectrics, combinations of these, and the like). The third passivation layer 407 may be formed to have a thickness of between about 2 µm and about 15 µm, such as about 5 µm.

After the third passivation layer 407 has been formed, a RDL opening may be made through the third passivation layer 407 by removing portions of the third passivation layer 407 to expose at least a portion of the underlying first RDL layer 405. The RDL opening allows for contact between the UBM 411 and the first RDL layer 405. The RDL opening may be formed using a suitable photolithographic mask and etching process, although any suitable process to expose portions of the first RDL layer 405 may alternatively be used.

The contact pad 409 may optionally be formed over and in electrical contact with the first RDL layer 405. The contact pad 409 may comprise aluminum, but other materials, such as copper, may alternatively be used. The contact pad 409 may be formed using a deposition process, such as sputtering, to form a layer of material (not shown) and portions of the layer of material may then be removed through a suitable process (such as photolithographic masking and etching) to form the contact pad 409. However, any other suitable process may be utilized to form the contact pad 409. The contact pad 409 may be formed to have a thickness of between about 0.5 µm and about 4 µm, such as about 1.45 µm.

Once the contact pad 409 has been formed, the UBM 411 may be formed in electrical contact with the contact pad 409. In an embodiment the UBM 411 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM 411. Any suitable materials or layers of material that may be used for the UBM 411 are fully intended to be included within the scope of the current application.

The UBM 411 may be created by forming each layer over the third passivation layer 407 and along the interior of the RDL opening through the third passivation layer 407 to the contact pad 409. The forming of each layer may be performed using a plating process, such as electrochemical plating, although other processes of formation, such as sputtering, evaporation, or PECVD process, may alternatively be used depending upon the desired materials. The UBM 411 may be formed to have a thickness of between about 0.7 µm and about 10 µm, such as about 5 µm. Once the desired layers have been formed, portions of the layers may then be removed through a suitable photolithographic masking and etching process to remove the undesired material and to leave the UBM 411 in a desired shape, such as a circular, octagonal, square, or rectangular shape, although any desired shape may alternatively be formed.

The contact bump 413 may comprise a material such as tin, or other suitable materials, such as silver, lead-free tin, copper, or gold. In an embodiment in which the contact bump 413 is a tin solder bump, the contact bump 413 may be formed by initially forming a layer of tin through such commonly used methods such as evaporation, electroplating, printing, solder transfer, ball placement, etc, to a thickness of, e.g., about 100 µm. Once a layer of tin has been formed on the structure, a reflow may be performed in order to shape the material into the desired bump shape.

On a second side of the substrate 101 opposite the first side of the substrate 101 over which the first passivation layer 401 has been formed, a fourth passivation layer 418, second contact pads 419, and second contact bumps 421 may be formed. The fourth passivation layer 418, similar to the second passivation layer 403, may be formed from a polymer such as polyimide, or may alternatively be formed of a similar material as the first passivation layer 401 (e.g., silicon oxides, silicon nitrides, low-k dielectrics, extremely low-k dielectrics, combinations of these, and the like). The fourth passivation layer 418 may be formed to have a thickness of between about 2 µm and about 15 µm, such as about 5 µm.

The second contact pads 419 may be formed over and in electrical contact with the TSVs 404. The second contact pads 419 may comprise aluminum, but other materials, such as copper, may alternatively be used. The second contact pads 419 may be formed using a deposition process, such as sputtering, to form a layer of material (not shown) and portions of the layer of material may then be removed through a suitable process (such as photolithographic masking and etching or chemical mechanical polishing) to form the second contact pads 419. However, any other suitable process may be utilized to form the second contact pads 419. The second contact pads 419 may be formed to have a thickness of between about 0.5 µm and about 4 µm, such as about 1.45 µm.

The second contact bumps 421 may comprise a material such as tin, or other suitable materials, such as silver, lead-free tin, or copper. In an embodiment in which the second contact bumps 421 is a tin solder bump, the second contact bumps 421 may be formed by initially forming a layer of tin through such commonly used methods such as evaporation, electroplating, printing, solder transfer, ball placement, etc, to a thickness of, e.g., about 100 µm. Once a layer of tin has been formed on the structure, a reflow may be performed in order to shape the material into the desired bump shape Returning to the first side of the substrate 101, a waveguide 402 may be formed within the opening 201 in order to accept and channel the light 412 to its desired destination (e.g., between an optical generating device 415 and an optical receiving device 417, both of which are described further below). The waveguide 402 may be any type of waveguide, such as a planar waveguide or a channel waveguide, and may comprise two different materials, a core material 408 and a cladding material 410, in which the core material 408 has a refractive index higher than the cladding material 410.

In an embodiment the core material 408 and the cladding material 410 comprise a combination of polymer materials, such as poly(methylmethacrylate) (PMMA), polystyrene (PS), polycarbonate, polyurethane, benzocyclo butane, perfluorovinyl ether cyclopolymer, tetrafluoroethylene, perfluorovinyl ether copolymer, silicone, fluorinated poly(arylene ether sulfide), poly(pentafluoro styrene), fluorinated dendrimers, fluorinated hyperbranched polymers, or the like. Alternatively, the core material 408 and the cladding material 410 may comprise deuterated and halogenrate polyacrylates, fluorinated polyimides, perfluorocyclobutyl aryl ether polymers, nonlinear optical polymers, or the like. In yet another embodiment, the core material 408 and the cladding material 410 may comprise silicon or silicon dioxide, to utilize the index of refraction between the materials to confine and constrain the path of the light 412 through the waveguide 402.

The core material 408 and the cladding material 410 of the waveguide 402 may be formed, e.g., by initially placing each layer or combination of layers onto the substrate 101 using a process such as spin coating, doctor blading, extrusion, lamination, or the like. Once the individual layers are in place, the individual layers may be patterned using, e.g., photolithographic masking and etching techniques to individually or collectively pattern the individual layers to form the desired shape of the waveguide 402.

Additionally, the waveguide 402 may optionally comprise one or more structures that aid in the transmittal and or conditioning of the light 412. As examples only, beam splitters, filters, or reflectors (not individually illustrated in FIG. 4) may optionally be included within the waveguide 402 as desired in order to better control and direct the received light 412. These and all such structures that may be utilized either within or with the waveguide 402 are fully intended to be included within the scope of the embodiments.

An optical generating device 415 may be connected to a first one of the contact bumps 413 in order to convert an electrical signal to an electromagnetic signal such as light 412 that will be constrained by the waveguide 402. In an embodiment the optical generating device 415 may be a laser diode, although any other suitable device that can translate an electrical signal to an electromagnetic signal may alternatively be utilized. In an embodiment the optical generating device 415 may be electrically and physically connected to the silicon optical bench 100 by placing the optical generating device 415 in physical connection with the contact bumps 413 and then performing a reflow process to reflow the contact bump 413 and connect the optical generating device 415 to the contact bump 413.

However, as one of ordinary skill will recognize, the use of a separate optical generating device 415 and its connection with the contact bump 413 is merely one embodiment, and is intended to be illustrative and not limiting. Rather, any suitable type of optical generating device 415 formed and connected to the silicon optical bench 100 in any fashion, may be utilized. For example, the optical generating device 415 may alternatively be a InP group semiconductor laser that is grown using methods such as metal organic vapor deposition onto the substrate 101 without the use of the contact bumps 413. These and any other suitable type optical generating device 415 that may be utilized to transform an electrical signal to an electromagnetic signal, or to merely direct an optical signal to the waveguide 402, may alternatively be used, and all such alternatives are fully intended to be included within the scope of the embodiments.

An optical receiving device 417 may be connected to another one of the contact bumps 413 in order to receive the light 412 from the waveguide 402 and transform the received light 412 back into an electrical signal. In an embodiment the optical receiving device 417 may be, e.g., a photodiode used to convert the light 412 to an electrical signal, although any suitable device may alternatively be utilized.

In an embodiment the optical receiving device 417 may be connected to the silicon optical bench 100 using, e.g., another one of the contact bumps 413. In an embodiment the optical receiving device 417 may be connected by placing the optical receiving device 417 into contact with the contact bump 413 and performing a reflow process to physically and electrically connect the optical receiving device 417 to the contact bump 413.

However, as one of ordinary skill will recognize, the use of a separate optical receiving device 417 and its connection with the contact bump 413 is merely one embodiment, and is intended to be illustrative and not limiting. Rather, any suitable type of optical receiving device 417 formed and connected to the silicon optical bench 100 in any fashion, may be utilized. For example, the optical receiving device 417 may alternatively be a photodiode grown epitaxially onto the substrate 101 without the use of the contact bumps 413. These and any other suitable type optical receiving devices 417 that may be utilized to transform an electromagnetic signal to an electrical signal may alternatively be used, and all such alternatives are fully intended to be included within the scope of the embodiments.

During operation, the optical generating device 415 will receive an electrical signal through, e.g., the TSV 404 and convert the electrical signal into light (labeled in FIG. 4 by arrows 412). The light 412 will travel towards the substrate 101 and be reflected by the reflecting material 406 towards the waveguide 402, which will guide the light 412 to a desired destination. Once it reaches the destination, the light 412 will exit the waveguide 402, reflect off the reflecting material 406 and reach the optical receiving device 417, which will convert the light 412 from an optical signal back to an electrical signal.

Additionally, while only the optical generating device 415, the waveguide 402, and the optical receiving device 417 are illustrated in FIG. 4, any number of other suitable devices may also be manufactured on the substrate 101 in order to manufacture the silicon optical bench 100. For example, other microwave or optical components may be included in order to transmit and/or process the various electrical and optical signals that will be utilized by the silicon optical bench 100 in order to achieve its desired function. These and all such structures are fully intended to be included within the scope of the embodiments.

In accordance with an embodiment, a method for manufacturing a device comprising masking a substrate with a patterned mask and exposing the substrate through the patterned mask to an etchant is provided. The etchant comprises a base, a surfactant, and an oxidant.

In accordance with another embodiment, a semiconductor material etchant comprising a base, a surfactant, and an oxidant is provided.

In accordance with yet another embodiment, a method of etching a substrate comprising applying an etchant to a substrate, the etchant comprising a base, a surfactant, and an oxidant, is provided. A portion of the substrate is oxidized to change the substrate from hydrophobic to hydrophilic, and an opening is formed in the substrate with the etchant.

In accordance with yet another embodiment, a semiconductor material etchant includes water, a base having a concentration of between 25%-wt and about 35%-wt, a surfactant having a concentration of between about 0.01%-wt and about 0.4%-wt, and an oxidant having a concentration of between about 0.1%-wt and about 0.2%-wt.

In accordance with yet another embodiment, a semiconductor material etchant includes a base for removing material from a waveguide substrate covered with a patterned hardmask. The base has a concentration of between 25%-wt and about 35%-wt. The semiconductor material etchant further includes a surfactant for modifying an angle of etching to about 45° from a major surface of the waveguide substrate. The surfactant is reactable on the waveguide substrate to form an oil by-product. The surfactant has a concentration of between about 0.01%-wt and about 0.4%-wt. The semiconductor material etchant further includes an oxidant for oxidizing the waveguide substrate beneath the oil by-product. The oxidant has a concentration of between about 0.1%-wt and about 0.2%-wt.

In accordance with yet another embodiment, a semiconductor material etchant includes water and a base for etching an opening in a semiconductor substrate. The base has a concentration of between 25%-wt and about 35%-wt. The semiconductor material etchant further includes a surfactant for modifying an angle of a sidewall of the opening to about 45° from a major surface of the semiconductor substrate. The surfactant is reactable on the semiconductor substrate to form an oil by-product. The surfactant has a concentration of between about 0.01%-wt and about 0.4%-wt. The semiconductor material etchant further includes an oxidant for oxidizing the semiconductor substrate beneath the oil by-product. The oxidant has a concentration of between about 0.1%-wt and about 0.2%-wt.

Although the present embodiments and their advantages have been described in detail, it should be understood that various changes, substitutions and alterations can be made herein without departing from the spirit and scope of the disclosure as defined by the appended claims. For example, many different chemicals may be used with or in place of the chemicals specifically described herein. Additionally, the etching solution and process may be used in the manufacture of different structures than a silicon optical bench, such as microelectromechanical (MEMS) devices.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor material etchant comprising:
   water;
   a base having a concentration of between 25%-wt and about 35%-wt;
   a surfactant having a concentration of between about 1.01%-wt and about 0.04%-wt; and
   an oxidant having a concentration of between about 0.1%-wt and about 0.2%-wt.

2. The semiconductor material etchant of claim 1, wherein the base is configured for etching an opening in a semiconductor substrate.

3. The semiconductor material etchant of claim 2, wherein the oxidant is configured for modifying a material of the semiconductor substrate from being hydrophobic to being hydrophilic.

4. The semiconductor material etchant of claim 2, wherein the surfactant is configured for modifying an angle of a sidewall of the opening to about 45° from a major surface of the semiconductor substrate.

5. The semiconductor material etchant of claim 2, wherein the surfactant is reactable with the base and the water to form an oil by-product on the semiconductor substrate.

6. The semiconductor material etchant of claim 5, wherein the oxidant is configured for oxidizing the semiconductor substrate beneath the oil by-product.

7. A semiconductor material etchant comprising:
   a base for removing material from a waveguide substrate covered with a patterned hardmask, the base having a concentration of between 25%-wt and about 35%-wt;
   a surfactant for modifying an angle of etching to about 45° from a major surface of the waveguide substrate, the surfactant reactable on the waveguide substrate to form an oil by-product, the surfactant having a concentration of between about 0.01%-wt and about 0.4%-wt; and an oxidant for oxidizing the waveguide substrate beneath the oil by-product, the oxidant having a concentration of between about 0.01%-wt and about 0.2%-wt.

8. The semiconductor material etchant of claim 7, wherein the oxidant is $H_2O_2$.

9. The semiconductor material etchant of claim 7, wherein the oxidant is ozone.

10. The semiconductor material etchant of claim 7, wherein the oxidant is $KMnO_4$.

11. The semiconductor material etchant of claim 7, wherein the base is KOH.

12. The semiconductor material etchant of claim 7, wherein the base is NaOH.

13. The semiconductor material etchant of claim 7, wherein the surfactant comprises a sulfonate base.

14. The semiconductor material etchant of claim 7, wherein the surfactant comprises alkyl polysaccharide.

15. A semiconductor material etchant comprising:
water;
a base for etching an opening in a semiconductor substrate, the base having a concentration of between 25%-wt and about 35%-wt;
a surfactant for modifying an angle of a sidewall of the opening to about 45° from a major surface of the semiconductor substrate, the surfactant reactable on the semiconductor substrate to form an oil by-product, the surfactant having a concentration of between about 0.01%-wt and about 0.4%-wt; and
an oxidant for oxidizing the semiconductor substrate beneath the oil by-product, the oxidant having a concentration of between about 0.1%-wt and about 0.2%-wt.

16. The semiconductor material etchant of claim 15, wherein the oxidant is configured for modifying a material of the semiconductor substrate from being hydrophobic to being hydrophilic.

17. The semiconductor material etchant of claim 15, wherein the oxidant is $H_2O_2$, ozone, or $KMnO_4$.

18. The semiconductor material etchant of claim 15, wherein the base is KOH or NaOH.

19. The semiconductor material etchant of claim 15, wherein the surfactant is a sulfonate base or alkyl polysaccharide.

20. The semiconductor material etchant of claim 15, wherein the surfactant reacts with the base and the water to form the oil by-product on the semiconductor substrate.

* * * * *

UNITED STATES PATENT AND TRADEMARK OFFICE
CERTIFICATE OF CORRECTION

PATENT NO. : 10,866,362 B2
APPLICATION NO. : 16/441785
DATED : December 15, 2020
INVENTOR(S) : Wan-Yu Lee et al.

Page 1 of 1

It is certified that error appears in the above-identified patent and that said Letters Patent is hereby corrected as shown below:

In the Claims

In Column 12, Line 39, Claim 1, delete "1.01%-wt" and insert --0.01%-wt--.

In Column 13, Line 3, Claim 7, delete "0.01%-wt" and insert --0.1%-wt--.

Signed and Sealed this
Thirtieth Day of March, 2021

Drew Hirshfeld
*Performing the Functions and Duties of the
Under Secretary of Commerce for Intellectual Property and
Director of the United States Patent and Trademark Office*